United States Patent [19]

Miyo

[11] Patent Number: 4,656,630
[45] Date of Patent: Apr. 7, 1987

[54] AUTOMATIC GAIN CONTROL CIRCUIT

[75] Inventor: Tokihiro Miyo, Kawasaki, Japan

[73] Assignee: Fujitsu Limited, Kawasaki, Japan

[21] Appl. No.: 687,812

[22] Filed: Dec. 31, 1984

[30] Foreign Application Priority Data

Jan. 10, 1984 [JP] Japan .............................. 59-002222

[51] Int. Cl.$^4$ .......................... H04J 3/06; H04B 11/03
[52] U.S. Cl. ..................................... 370/104; 455/249
[58] Field of Search ................ 370/104; 455/240, 234, 455/249; 375/28

[56] References Cited

U.S. PATENT DOCUMENTS

| | | | |
|---|---|---|---|
| 4,232,197 | 11/1980 | Acampora et al. | 370/104 |
| 4,339,824 | 7/1982 | Tanimoto | 370/104 |
| 4,355,414 | 10/1982 | Inoue | 455/249 |
| 4,483,000 | 11/1984 | Yamamoto et al. | 370/104 |

FOREIGN PATENT DOCUMENTS 0099702 2/1984 European Pat. Off. .

OTHER PUBLICATIONS

IEEE International Conference on Communications: Integrating Communication for World Progess, vol. 1/3, 19th–22nd Jun. 1983, pp. 387–391, IEEE, Boston, USA; R. L. Wallace: "Design Features and Performance of High Speed TDMA Demodulator".

Primary Examiner—Douglas W. Olms
Assistant Examiner—Curtis Kuntz
Attorney, Agent, or Firm—Staas & Halsey

[57] ABSTRACT

An automatic gain control (AGC) circuit has a first filter to which a received signal is applied, followed by a variable level adjusting circuit, for producing an automatic gain controlled signal. A feedback loop set up between the input and output of the variable level adjusting circuit, contains a second filter exhibiting a narrower equivalent noise band width than that of the first filter. The second filter responds a particular signal component having a predetermined frequency spectrum and a certain duration and performs an integration operation on the particular signal component.

15 Claims, 16 Drawing Figures

AUTOMATIC GAIN CONTROL CIRCUIT

BACKGROUND OF THE INVENTION (1) Field of the Invention

The present invention relates to an automatic gain control (AGC) circuit. More particularly, it relates to an AGC circuit preferably applied to a variable gain amplifier operating as a receiver of radio wave signals having an abnormal signal-to-noise (S/N) ratio, such as radio wave signals transmitted via an artificial satellite transponder.

(2) Description of the Related Art

Recently, in radio communication systems, various information sets are transformed into digital signals and thus transformed information sets transmitted to a remote office through a digital radio transmission line. In such radio communication systems, the quality of the signal received is often deteriorated by the condition of the related radio transmission line.

To cope with this quality deterioration, a number of methods for modulating the transmission signals have been proposed; among which is the phase shift keying (PSK) method.

In a data transmitting-receiving system, received digital modulation signals modulated under, for example, the PSK method, are first applied to an AGC circuit for level stabilization and demodulated through a synchronous detection operation, and the original digital data is then reproduced. Obviously, in the above operation, the AGC circuit must operate normally, since it is located at the initial stage of the receiver unit. If the AGC operation is abnormal, the resultant reproduced digital data will necessarily contain errors.

However, a problem occurs in the prior art AGC circuit where the AGC circuit can no longer maintain a normal AGC operation when used for receiving signals having an abnormal S/N ratio. Such abnormal S/N ratio signals often occur in, for example, satellite communication systems.

SUMMARY OF THE INVENTION

Accordingly, an object of the present invention is to provide an improved AGC circuit which will maintain its inherent AGC function at a normal level even when the received signals have an abnormal S/N ratio.

To attain the above object, the AGC circuit according to the present invention incorporates a narrow-band filter. The narrow-band filter is responsive to a predetermined frequency spectrum appearing in the received signals and allows this spectrum to pass therethrough. The thus filtered output from the narrow-band filter increases with the lapse in time, and the maximum level of the filtered output is held thereafter for a predetermined period and used as a control input of a variable level adjusting means for achieving automatic gain control.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the prior art and the problems therein will first be described with reference to the related figures. Further, for ease of comprehension, the following explanations will be primarily made by taking a satellite communication system operated under time division multiple access (TDMA) and using the PSK method as an example.

Figure 1:
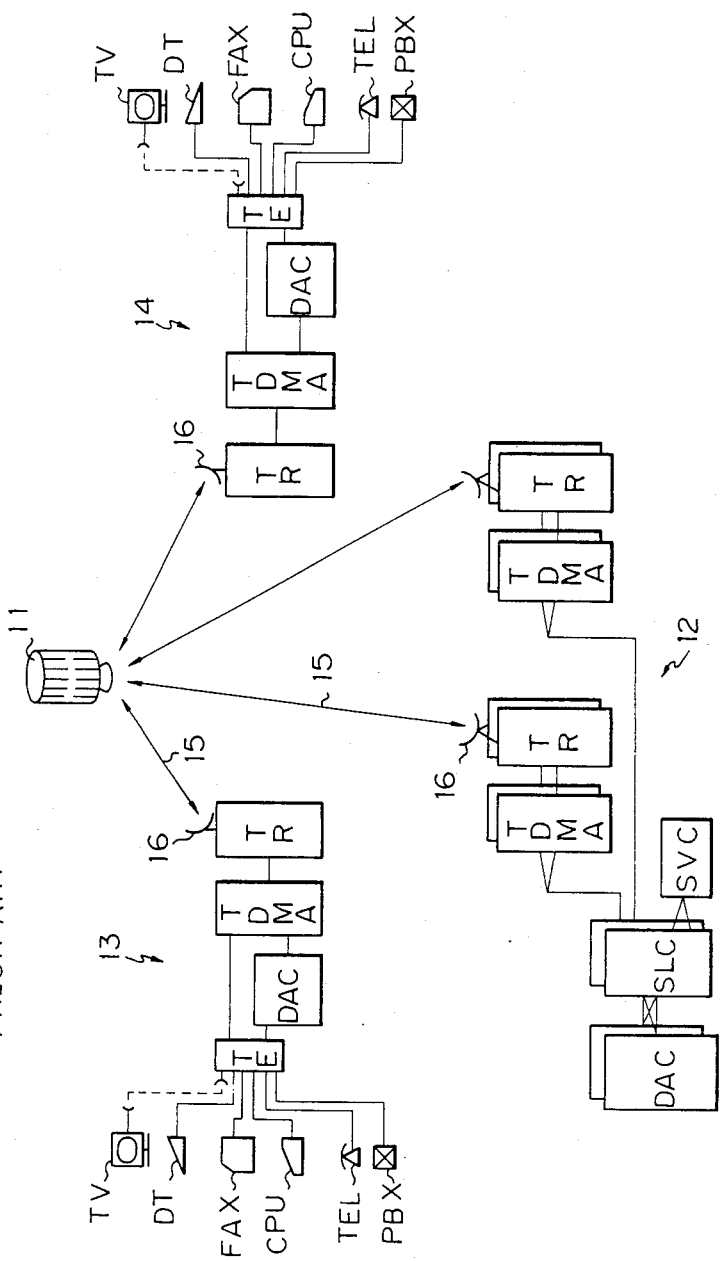
FIG. 1 is a general view of a known satellite communication system to which the present invention is preferably adapted.

FIG. 1 is a general view of a known satellite communication system to which the present invention is preferably adapted. In FIG. 1, reference numeral 11 represents an artificial satellite in geostationary orbit, 12 represents a reference office or station, and 13 and 14 represent a plurality of remote offices or stations (only two are illustrated for simplicity) on land. 15 and 16 represent, respectively, radio transmission lines and respective antennas for communicating various sets of information therebetween. The reference office 12 operates chiefly to supervise and control communications between the remote offices 13 and 14, under predetermined protocols. This reference office 12 is basically comprised of a demand-assignment control (DAC) unit, a satellite link control (SLC) unit, a TDMA control unit (TDMA), a transmitting-receiving (TR) unit, and a supervising control (SVC) unit. The units TDMA and TR (on the right of the drawing) in the reference office 12 function as back-up units. Each of the remote offices 13 and 14 has a structure similar to that of the reference office 12, with the following exceptions. Each remote office 13 and 14 is further equipped with a terminal equipment (TE) unit. The terminal equipment TE unit operates to achieve multiplexing or demultiplexing from or to a variety of peripheral devices, such as a television set TV, a data terminal DT, a facsimile FAX, a computer CPU, a telephone set TEL, a private branch exchange PBX, and so on. In the satellite communication system of FIG. 1, the AGC circuit to which the present invention refers is mounted in each of the transmitting-receiving units TR, especially in the receiving side.

Figure 2:
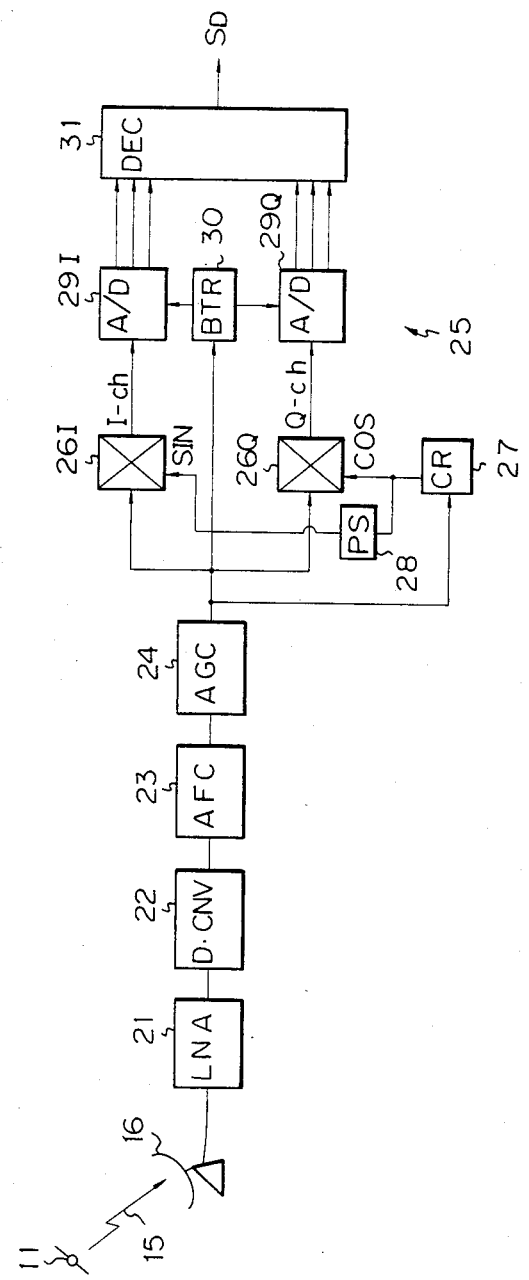
FIG. 2 is a block diagram of a conventional receiving and demodulating part in each remote office.

FIG. 2 is a block diagram of a conventional receiving and demodulating part in each remote office. The receiver unit is divided into two stages, i.e., an initial amplifier stage having a low noise amplifier (LNA) 21 and a down converter (D·CNV) 22, and a demodulator stage. The demodulator stage is composed of an automatic frequency controller (AFC) 23, an automatic gain controller (AGC) 24, and a quadrature demodulator 25. Of these members 21 through 25, the present invention is specifically directed to the AGC 24.

The received signal at the antenna 16 has a very low level, and therefore, is amplified by the amplifier 21 without amplifying the excess thermal noise. The down converter 22 is comprised of a local oscillator and a mixer and produces an intermediate frequency (IF) received signal. The AFC 23 maintains the frequency of the IF received signal at a predetermined constant value, and the level thereof is then automatically adjusted to a suitable range by the AGC 24. The level adjusted signal is supplied to the demodulator 25 to obtain the original (i.e., demodulated) digital data signal $S_D$.

In the demodulator 25, the level adjusted signal from the AGC 24 is given to both an in-phase (i) channel (I-ch) mixer 26I and a quadrature-phase (Q-ch) mixer 26Q to produce the I-ch signal and the Q-ch signal, respectively. The mixing operation is achieved with a reproduced reference carrier generated by a carrier recovery circuit (CR) 27, one output of which is phase shifted by $\pi/2$ at a phase shifter (PS) 28. The I-ch and Q-ch signals are supplied to analog/digital converters (A/D) 29I and 29Q, respectively, in which the polarity and level are determined instantaneously by clock signals supplied from a bit timing recovery circuit (BTR) 30 and then decoded by an error correcting decoder (DEC) 31, to produce the signal $S_D$.

Figure 3:
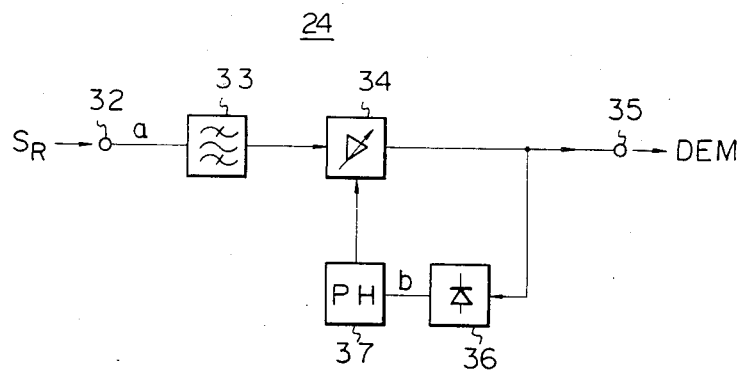
FIG. 3 is a circuit diagram of a prior art AGC circuit.

FIG. 3 is a circuit diagram of a prior art AGC circuit. The construction of the AGC circuit 24 of FIG. 2 is conventionally as shown in FIG. 3, and is usually known as a peak-hold type circuit. The received signal $S_R$ is first applied to a band pass filter 33 via an input terminal 32, and the filtered output from the filer 33 is then applied to a variable level adjusting or circuit means 34. The variable level adjusting means 34 is usually realized as a variable gain amplifier, and hereinafter the circuit 34 will be referred to as the variable gain amplifier. The gain controlled output is given, on one hand, to the demodulator DEM 25 via an output terminal 35. On the other hand, the level controlled output is given to a detector 36, especially an envelope detector, and then supplied, by way of a peak hold part 37, to a control input of the variable gain amplifier 34.

Figure 4A:
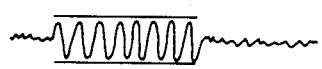
FIGS. 4(a) and 4(b) depict waveforms of signals appearing at portions a and b, respectively, in FIG. 3.
Figure 4B:
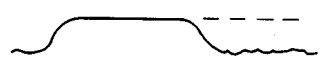

FIG. 4 depicts waveforms of signals appearing at portions a and b shown in FIG. 3. Under the TDMA, each burst-like received signal $S_R$ appears at the portion a (FIG. 3) with a waveform shown in FIG. 4(a). The burst-like received signal $S_R$ is then amplified by the variable gain amplifier 34. The level controlled output is then transformed by the detector 36 and appears at the portion b (FIG. 3), with a solid line waveform as shown in FIG. 4(b). The peak value thereof is held thereafter, at the peak hold part 37, shown by a broken line level of FIG. 4(b). The held peak value is used for achieving level control at the amplifier 34.

The prior art AGC circuit of FIG. 3 has two features, as shown below:

(1) Undesirable increases in noise do not occur even in an interval between each two adjacent burst signals. This is because the peak value is continually supplied to the control input of the amplifier 34 even during such an interval, as depicted in FIG. 4(b).

(2) Undesirable variation in the level of the level controlled output does not occur at each head portion of the burst signal. This is because so-called acquisition is not needed every time the burst signal appears, due to the presence of the aforesaid peak held value.

Note, in recent satellite communication systems, the so-called Viterbi coder-decoder (CODEC) is in practical use. The Viterbi CODEC, especially the soft decision type, has a remarkable capability for error correction, and therefore, it can seemingly improve the quality of the radio transmission line, even though the quality thereof is, in actuality, very poor. As is known, error correcting capability depends on an encoding ratio R, a constraint length K, and so on. For example, when a 3-bit soft decision type Viterbi CODEC having conditions wherein $R=\frac{1}{2}$ and $K=7$, is used, an error correcting capability can be expected which is comparable with an improvement in the S/N ratio of 5.5 dB or more. Incidentally, the soft decision is performed by the A/D converters 29I and 29Q shown in FIG. 2. The aforesaid term "3-bit" corresponds to three bit lines provided by each of these A/D converters, as shown in FIG. 2. Further, the error correction is performed in the decoder (DEC) 31 shown in FIG. 2.

When it is desired to take advantage of the capabilities of the Vierbi CODEC, it is important to recognize that a AGC circuit must be employed, which can operate with a high degree of stability even when the received signal $S_R$ has an abnormal S/N ratio, to match the high resolution available from the Viterbi CODEC. In other words, the Viterbi CODEC cannot exhibit its highest capability unless a high-performance AGC circuit is used, instead of the peak hold type AGC circuit shown in FIG. 3, because the AGC circuit of FIG. 3 produces the problems mentioned below when dealing with an abnormal S/N ratio received signal. That is, if the S/N ratio is as low as 6 dB or less, there is an increasing likelihood that the peak noise level will exceed the signal level. In this case, the peak hold part 37 (FIG. 3) necessarily holds not the signal level but the peak noise level. Accordingly, the signal ($S_R$) level at the output of the variable gain amplifier is adjusted to a lower level, as not intended, due to the peak held noise level. The lower the S/N ratio, the higher the tendency for the above to occur.

Furthermore, it is also important to recognize that the level change of the level controlled output from the amplifier 34 (FIG. 4) must be varied within as narrow a range as possible. This is because, if the level change occurs within a wide range, the threshold levels used for achieving the aforesaid level change also vary according to the level variation. Therefore, the error correcting capability is necessarily reduced. To summarize, it is difficult for the prior art AGC circuit to stably maintain the level of the received signal at a suitable level for signals having an abnormal S/N ratio.

Figure 5:
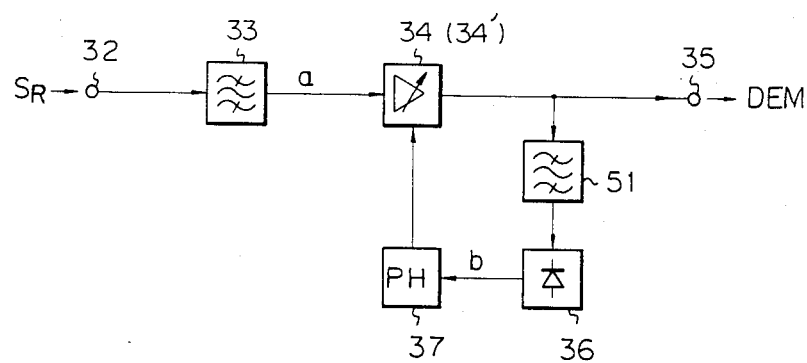
FIG. 5 is a circuit diagram of an AGC circuit according to a first embodiment of the present invention.

FIG. 5 is a circuit diagram of an AGC circuit according to a first embodiment of the present invention. In FIG. 5, members identical to those of previous figures are represented by the same reference numerals or symbols (the same applies for later figures). In the AGC circuit 50 of the first embodiment, the received signal $S_R$ is given to the variable level adjusting means 34, via the band pass filter 33, as in the prior art AGC circuit of FIG. 3. The difference here is that a narrow-band filter 51 is newly introduced therein, which filter 51 is used in consideration of the fact that the received signal $S_R$ generally includes at least one particular signal component with a predetermined frequency spectrum lasting a certain duration. Such a particular signal component having the predetermined frequency spectrum may exist in a modulated signal with a predetermined constant modulation frequency. Also, such a particular signal component having a predetermined frequency spectrum may exist in a unmodulated carrier signal at the carrier frequency. The newly employed narrow-band filter 51 is responsive only to such a particular signal component. Thus the filter 51 plays a significant role in the AGC operation, as will be described below.

Referring to FIG. 5, the received signal $S_R$ is first applied to the band pass filter 33. The filter 33 is generally designed to provide a bandwidth suitable for achieving transmission of the signal wave. Usually, the suitable bandwidth of the filter 33 is determined based on Nyquist's criterion for data transmission, i.e., the so-called Nyquist bandwidth. If the received signal $S_R$ is a four-phase PSK signal at a bit rate of 50 Mbps, for example, a minimum bandwidth is selected as 25 MHz in accordance with the Nyquist's criterion. In actuality, the bandwidth is designed to be a value 1.1 through 1.3 times the thus determined bandwidth.

The filtered output from the filter 33 is amplified by the variable level adjusting means 34, realized as a variable gain amplifier in this example. The thus amplified output is sent, on one hand to the output terminal 35 and, on the other hand, to the narrow-band filter 51 though which the bandwidth is further restricted.

Figure 6A:
FIGS. 6(a) and 6(b) depict waveforms of signals appearing at portions a and b, respectively, in FIG. 5.

FIG. 6 depicts waveforms of signals appearing at portions a and b shown in FIG. 5. If the received signal $S_R$ is a four-phase PSK signal, as previously assumed, and has been processed as a TDMA signal, i.e., PSK-TDMA signal, the PSK-TDMA burst signal is usually set up with a signal pattern as shown in FIG. 6(a). The signal pattern is basically classified into a carrier recovery (CR) part and an information (INF) part. The CR part corresponds to the aforesaid particular signal having a predetermined spectrum, i.e., a carrier frequency, with a predetermined constant duration, as indicated by t. The CR part is composed of the unmodulated carrier signal use for establishing synchronization by means of the carrier recovery circuit (CR) 27 shown in FIG. 2. If the CR part is composed of, for example, 100 symbols, the narrow-band filter 51 is designed to exhibit an integration characteristic linearly during at least a 100 symbol length. Of course, the time constant of the integration can be longer than a 100 symbol length. An equivalent noise band width $N_{bw}$ of the filter 51 is expressed as follows, when filter 51 fully integrates an amplified output having a 100 symbol length.

$$N_{bw} = \frac{1}{T} = \frac{1}{Ts \times 100} = 0.25 \text{ MHz}$$

where T denotes an integration time of the filter 51, and $Ts \times 100$ denotes the length of the CR part and is identical to the duration t shown in FIG. 6(a). The CR part length is expressed, in terms of time, as about $$4 \left( \frac{100 \text{ symbols}}{25 \text{ MHz}} \right) \mu \text{ s}.$$

As a result, the S/N ratio at the bandpass filter 33 with respect to the CR part can be improved, by means of the narrow-band filter 51, by a hundred times $$\left( \frac{25 \text{ MHz}}{0.25 \text{ MHz}} \right),$$

i.e., 20 dB, when the bandwidth of the bandpass filter 33 is 25 MHz, as assumed above. Thus, the S/N ratio regarding the CR part is not constant when passed through the narrow-band filter 51, but increases during an elapsed time with a positive inclination of the first order, and finally reaches the maximum S/N ratio, i.e., a better S/N ratio at the end of the duration t. This is a feature of the present invention, and attains the object of the present invention mentioned previously.

Figure 6B:

The filtered signal with the improved S/N ratio is detected by the envelope detector 36 to produce the detected output with the waveform shown by a solid line in FIG. 6(b). The peak value P thereof is detected and held, as shown by the broken line in FIG. 6(b), by the peak hold part (PH) 37. The thus held peak value is then applied to the variable gain amplifier 34, at its control input.

The level adjusting means can be realized by not only the aforementioned widely known variable gain amplifier, but also by a variable voltage attenuator. This is also true for each embodiment of the present invention described hereinafter.

Figure 7:
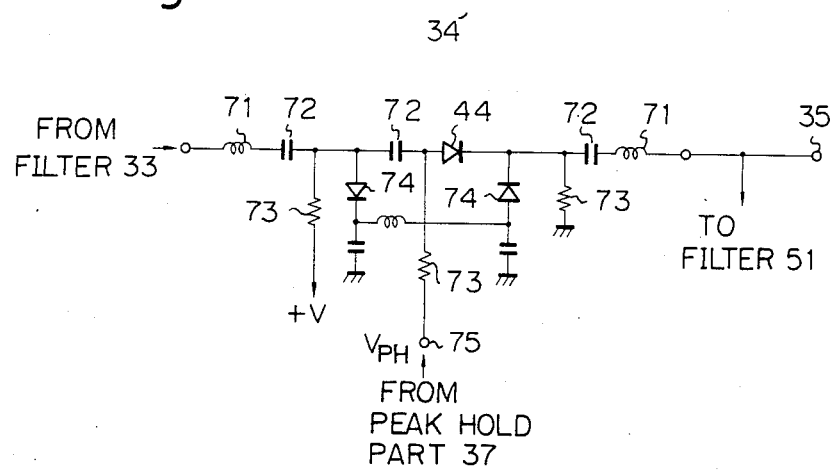
FIG. 7 is a circuit diagram of one example of a variable voltage attenuator for realizing the variable level adjusting means.

FIG. 7 is a circuit diagram of one example of a variable voltage attenuator for realizing the variable level adjusting means. The variable voltage attenuator 34' is comprised of coils 71, capacitors 72, resistors 73, and PIN diodes 74.

Figure 8:
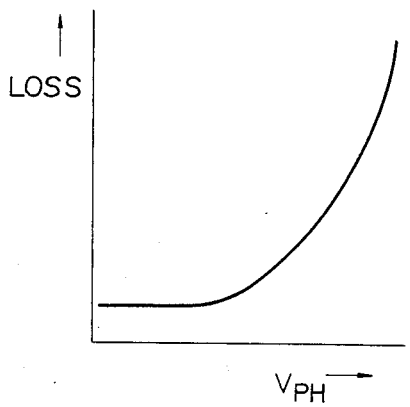
FIG. 8 is a graph representing an attenuation loss (LOSS) characteristic with respect to a control voltage ($V_{PH}$)

FIG. 8 is a graph representing an attenuation loss (LOSS) characteristic with respect to a control voltage ($V_{PH}$). The control voltage $V_{PH}$ is given from the peak hold part 37, as a peak hold voltage, to a control input 75 thereof. As seen from FIG. 8, the attenuation loss is defined in accordance with the voltage $V_{PH}$.

Figure 9:
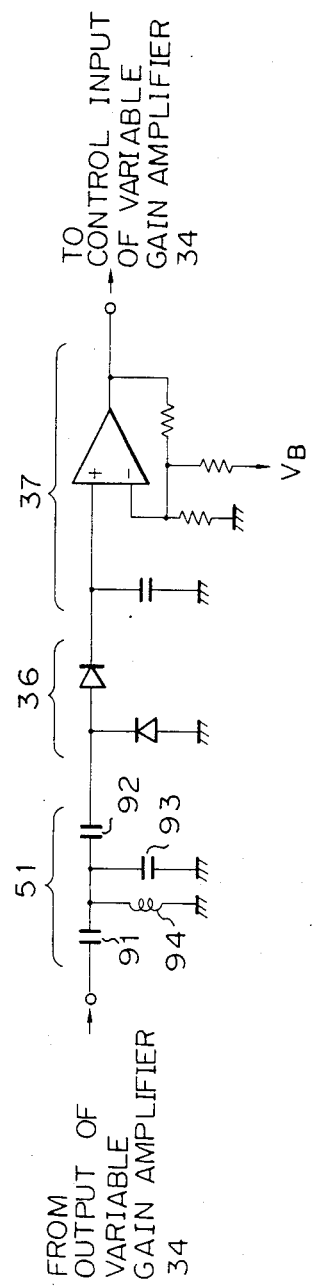
FIG. 9 is a detailed example of a part of the AGC circuit shown in FIG. 5.

FIG. 9 is a detailed example of a part of the AGC circuit shown in FIG. 5. That is, details of the narrow-band filter 51, the envelope detector 36, and the peak hold part 37, in the AGC circuit 50 of FIG. 7, are illustrated. The narrow-band filter 51, which is a feature of the present invention, is comprised of a first capacitor 91, a second capacitor 92, a third capacitor 93, and a coil 94. The first and second capacitors 91 and 92 are connected in series between the input and ouput of the narrow-band filter 51, and the third capacitor 93 and the coil 94 are connected in parallel; one end of the parallel circuit (93, 94) is grounded and the other end is connected to the intermediate connecting point between the first and second capacitors 91 and 92. The detector 36 is comprised of diodes. The peak hold part 37 is comprised of a capacitor and a voltage buffer amplifier which is biased by a bias voltage source $V_B$.

Regarding the peak hold part 37, the related peak holding time may be freely determined according to the system design. If the AGC circuit 50 is used for achieving AGC operation with respect to the received PSK-TDMA signal, the peak holding time may be determined as more than 2 ms, which corresponds to the duration of each frame composing the TDMA signal.

Figure 10:
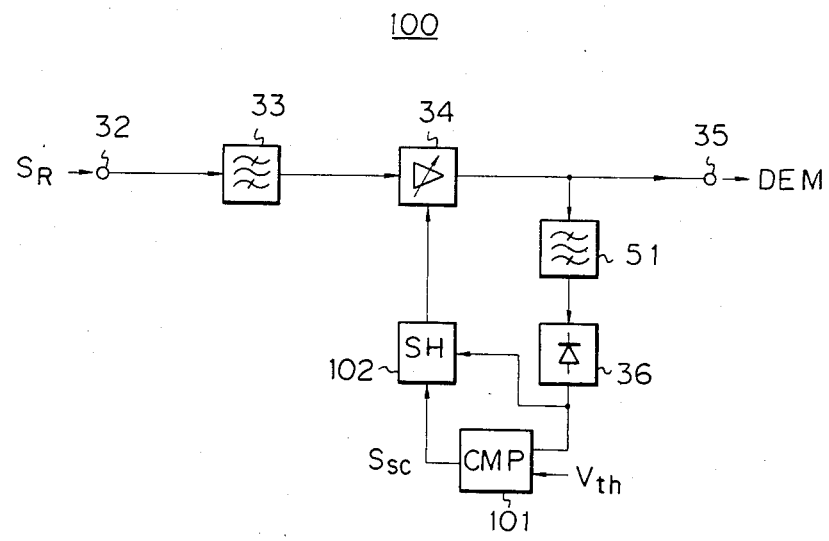
FIG. 10 is a circuit diagram of an AGC circuit according to a second embodiment of the present invention.

FIG. 10 is a circuit diagram of an AGC circuit according to a second embodiment of the present invention. The major part of the second embodiment is identical to that of the first embodiment shown in FIG. 5. The difference between the circuit of FIG. 10 and the circuit of FIG. 5 is that the peak hold means, i.e., the peak hold part 37 of FIG. 5, is realized in FIG. 10 by means of both a voltage comparator (CMP) 101 and a sample and hold circuit (SH) 102. The detected output from the envelope detector 36 is given, on one hand, to the voltage comparator 101 at its first input, and, on the other hand, to the sample and hold circuit 102 at its first input. The voltage comparator 101 is supplied, at its second input, with a predetermined threshold voltage $V_{th}$. The sample and hold circuit 102 is controlled by a sampling control signal given at its second input from the comparator 101. The comparator 101 operates to detect the peak side level of the output from the detector 36 relative to the $V_{th}$ level. The $V_{th}$ level may be clarified with reference to the chain dotted line $V_{th}$ shown in FIG. 6(a). When the comparator 101 finds the peak side level of the output, it produces the aforesaid sampling control signal to sample and hold the output of the peak side level selectively. Thus, the output from the sample and hold circuit 102 is indicative of approximately the peak value P shown in FIG. 6(b), as in the peak hold part 37 of FIG. 5. Thus, the sample and hold signal is supplied to the control input of the variable gain amplifier 34, which also may be a variable voltage attenuator 34' (FIG. 7).

Figure 11:
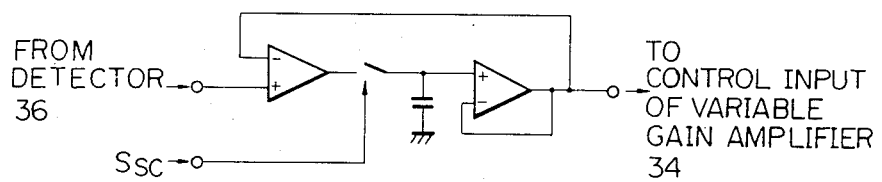
FIG. 11 is a detailed example of the sample and hold circuit shown in FIG. 10.

FIG. 11 is a detailed example of the sample and hold circuit shown in FIG. 10. The sample and hold circuit 102 is comprised, as illustrated, of a capacitor, a switch, and two operational amplifiers. The switch is controlled to turn ON or OFF in accordance with the aforesaid sampling control signal, which is represented by $S_{SC}$.

Figure 12:
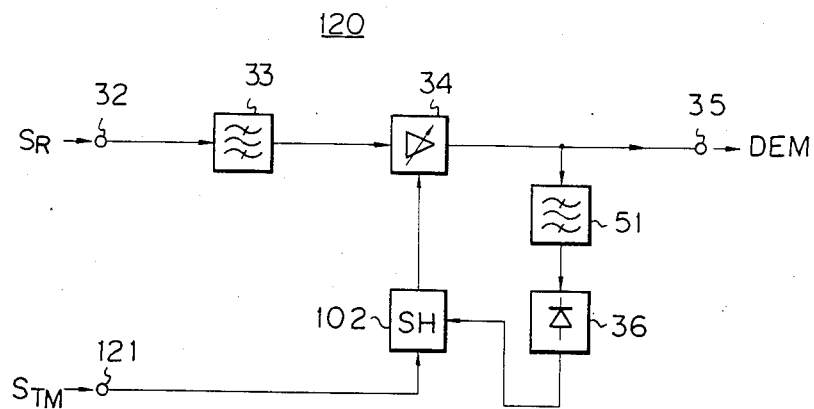
FIG. 12 is a circuit diagram of an AGC circuit according to a third embodiment of the present invention.

FIG. 12 is a circuit diagram of an AGC circuit according to a third embodiment of the present invention. The AGC circuit 120 is similar to the AGC circuit 100 shown in FIG. 10, with the comparator 101 removed therefrom. That is, the sampling control signal is supplied as a timing signal $S_{TM}$ applied to a control terminal 121. The timing signal $S_{TM}$ is made active every time the aforesaid particular signal appears. This particular signal should have a predetermined frequency spectrum with a certain duration and allowed to pass by the narrow-band filter 51. If the received signal $S_R$ is supplied as the PSK-TDMA signal, the timing signal $S_{TM}$ is made active every time the aforesaid CR part (refer to FIG. 6(a) is expected to occur. This is possible because, under TDMA, the frame format of each PSK-TDMA is determined in advance, and therefore, the exact timing at which the CR part of the coming PSK-TDMA burst signal will occur, can be easily forecast. The CR part will be clarified with reference to FIG. 13.

Figure 13:
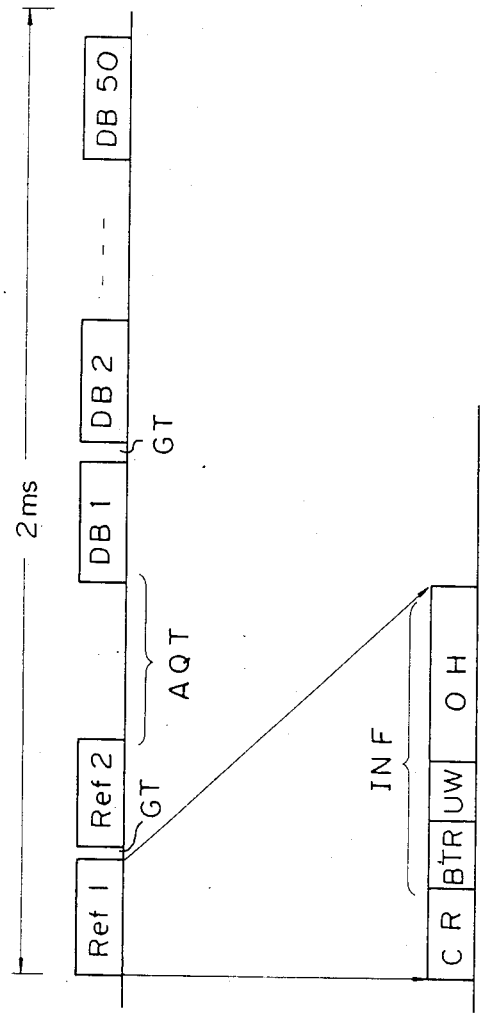
FIG. 13 depicts signal allocations for explaining a known frame format of the TDMA signal.

FIG. 13 depicts signal allocations for explaining a known frame format of the TDMA signal. In FIG. 13, the CR part is represented by CR in the lower bottom row. The top row represents a frame for composing each PSK-TDMA burst signal. The duration of the frame is, for example, selected as 2 ms. The frame is divided into many time slots, and these time slots are allotted for various sets of information. The characters Ref 1 and Ref 2 are allotted, respectively, to the normal part and the back-up part of the reference office 12 shown in FIG. 1. The characters DB1 through DB50 are allotted, as data bursts, to individual remote offices (represented by 13 and 14 in FIG. 1), assuming that there are fifty remote offices. An acquisition time slot AQT is used at the initial acquisition for measuring the delay deviation between each remote office and the satellite. The character GT represents a guard time used for avoiding a collision between each two adjacent sets of information. The reference burst Ref 1 is enlarged and depicted in detailed on the bottom row. The CR part is composed of the unmodulated carrier signal and accepted by the carrier recovery circuit (CR) 27 (FIG. 2) to establish synchronization. The BTR part indicates the bit rate by which the original transmission data is modulated. The BTR part is accepted by the bit timing recovery circuit (BTR) 30 (FIG. 2). The UW part represents a unique word which has special bit patterns used for indication of the information start timing for each burst signal. The OH part represents overhead information containing various sets of information for control. Note, the CR part and the information part (INF) correspond to those of FIG. 6(a).

Figure 14:
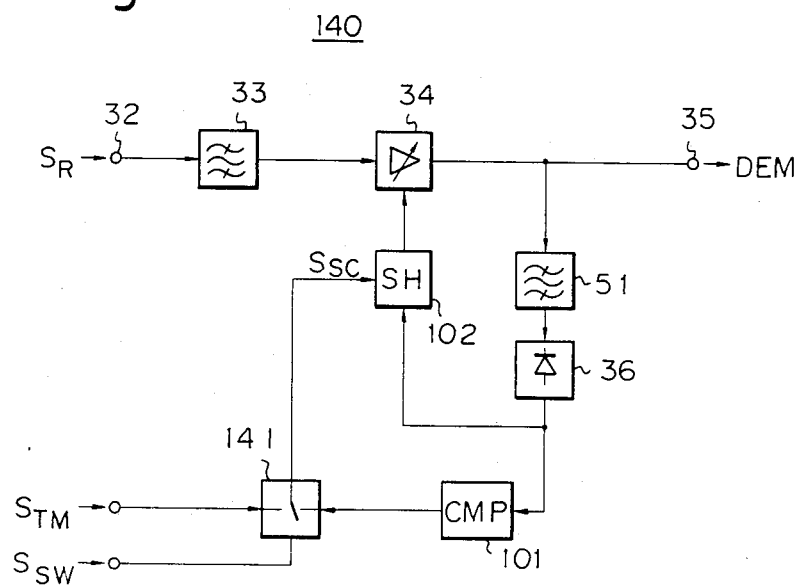
FIG. 14 is a circuit diagram of an AGC circuit according to a fourth embodiment of the present invention.

FIG. 14 is a circuit diagram of an AGC circuit according to a fourth embodiment of the present invention. The AGC circuit 140 is a combination of the AGC circuit 100 (FIG. 10) and the AGC circuit 120 (FIG. 12), except that a selector 141 is newly introduced therein. In the AGC circuit 140, the sampling control signal $S_{SC}$ is supplied from either the voltage comparator (CMP) 101 or a timing signal generator (not shown in FIG. 14, but shown in FIG. 15) which produces the timing signal $S_{TM}$. This selection between the two is made by the selector 141 under control of a switch control signal $S_{SW}$. The switch control signal $S_{SW}$ instructs the selector 141 to make contact with the voltage comparator 101 when the synchronization is not yet established in the remote office containing the AGC circuit 140. Inversely, the switch control signal $S_{SW}$ instructs the selector 141 to make contact with the aforesaid timing signal generator when the synchronization is established in the above-mentioned remote office. Under the synchronization state, the remote office produces the timing signal $S_{TM}$ by using a unique word detection signal and an assignment signal. The unique word detection signal indicates whether or not the received TDMA burst signal is for the respective remote office. The assignment signal is obtained after processing by a central processing unit (CPU) through communication with the reference office. The assignment signal indicates which one of the time slots (refer to DB1–DB50 in FIG. 13) the remote office should occupy. Once both the unique word signal and the assignment signal are obtained in the remote office, it is easy to forecast a timing at which the CR part in the corresponding data burst (DB) will appear. This timing information is processed as the timing signal $S_{TM}$ by the timing signal generator. Also the switch control signal $S_{SW}$ is practically produced therefrom as explained below.

Figure 15:
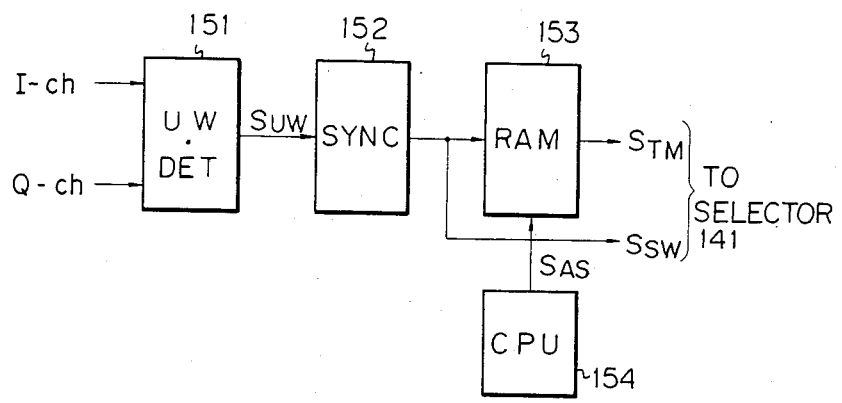
FIG. 15 is a block diagram of the timing signal generator.

FIG. 15 is a block diagram of the timing signal generator. The timing signal generator 150 is comprised of a unique word detector (UW DET) 151, a synchronization controller (SYNC) 152, a random access memory (RAM9 153, and the aforesaid central processing unit (CPU) 154. The assignment signal $S_{AS}$ is derived from the CPU 154, through the communication with the reference office 12 (FIG. 1) and then stored in the RAM 153. The assignment signal $S_{AS}$ is indicative of an assignment information allotted to the related remote office. The unique word detection signal $S_{UW}$, generated by the unique word detector 151, is read from the RAM 153 via the synchronization controller 152. The signal $S_{UW}$ supplied via the synchronization controller 152, can also be used as the aforesaid switch control signal $S_{SW}$.

In the RAM 153, incremental address signals are generated inside and the RAM 153 starts incrementing the address once the synchronization signal is given thereto from the SYNC 152. The RAM 153 then produces the timing signal $S_{TM}$, which timing corresponds to the head of the data bursts (DB), i.e., the CR part of the data bursts. Note, the timing signal generator 150 is realized as a part of the preexisting TDMA unit shown in FIG. 1, as each block of TDMA.

Figure 16:
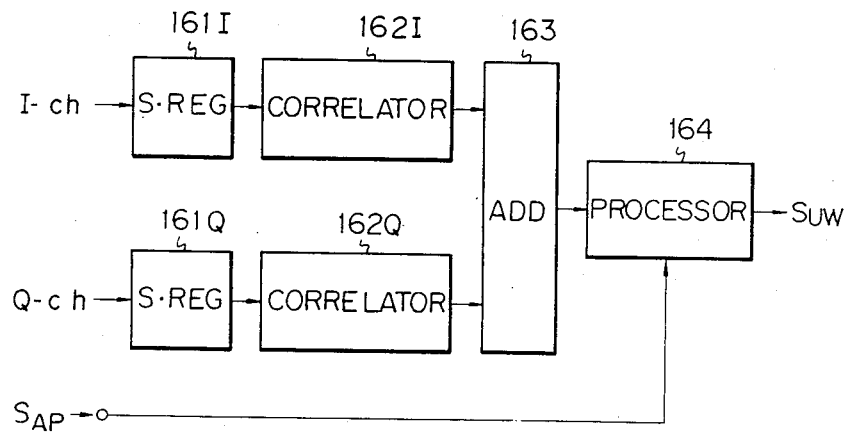
FIG. 16 is a detailed block diagram of the unique word detector shown in FIG. 15.

FIG. 16 is a detailed block diagram of the unique word detector shown in FIG. 15. The unique word detector 151 receives, at its input stage, both I-ch and Q-ch signals created in the demodulator 25, as shown in FIG. 2. The demodulated I-ch and Q-ch signals are added together in an adder tree (ADD) 163, via the series circuit of an I-ch shift register (S-REG) 161I, an I-ch correlator 162I, the series circuit of a Q-ch shift register 161Q, and a Q-ch correlator 162Q, respectively. The thus added signal is then processed by an output processor 164. The processor 164 is activated every time a narrow aperture signal $S_{AP}$ is produced. The signal $S_{AP}$ is usually produced in the TDMA unit and indicates the estimated timing in which the unique word signal should be positioned in the TDMA frame (refer to FIG. 13).

As explained above in detail, the AGC circuit according to the present invention can still maintain normal AGC operation even for the received signal having an abnormal S/N ratio, and therefore, the AGC circuit may be preferably used in satellite communication systems, especially a system operated under the TDMA method.

What is claimed is:

1. An automatic gain control circuit receiving a received signal, comprising:
    a band pass filter, operatively connected to receive the received signal, allowing desired frequency spectrum components of the received signal to pass therethrough as a first filtered output signal having a first equivalent noise bandwidth;
    variable level adjusting means, operatively connected to receive the filtered output signal from said band pass filter, for effecting an automatic level control of the first filtered output signal and producing a level adjusted output signal as an automatic gain controlled signal, said variable level adjusting means having a control input;
    a particular signal filter, operatively connected to receive the level adjusted output signal from said variable level adjusting means, responsive only to a particular signal component, having a predetermined frequency spectrum with a certain duration, included in the desired frequency spectrum components, said particular signal filter performing an integration operation on the particular signal component, and producing a second filtered output signal exhibiting a second equivalent noise bandwidth, when the certain duration ends, which is narrower than the first equivalent noise bandwidth of said band pass filter; and
    detector means, for detecting the second filtered output signal with the second equivalent noise bandwidth and for supplying a level control signal to the control input of said variable level adjusting means.

2. An automatic gain control circuit as set forth in claim 1, wherein said detector means comprises:
    a detector, operatively connected to said filter, for detecting the second filtered output signal, said detector having an output; and
    peak holding means, operatively connected between the output of said detector and the control input of said variable level adjusting means, said peak holding mean indicating a peak value, appearing when the certain duration ends, of the second filtered output signal with the second equivalent noise bandwidth.

3. An automatic gain control circuit as set forth in claim 2, wherein said peak holding means comprises a peak holding circuit operatively connected to the output of said detector and the control input of said variable level adjusting means.

4. An automatic gain control circuit as set forth in claim 2, wherein said particular signal filter comprises a narrow-band filter operatively connected between said variable level adjusting means and said detector.

5. An automatic gain control circuit as set forth in claim 4, wherein the received signal is carried by a carrier signal, having a carrier frequency, the carrier signal being present in the received signal for a short duration as an unmodulated carrier signal to provide the particular signal component to which said narrow-band filter is responsive.

6. An automatic gain control circuit as set forth in claim 5, wherein the unmodulated carrier signal is present, under a time division multiple access mode using burst signals, as a carrier recovery part contained in each of the burst signal.

7. An automatic gain control circuit as set forth in claim 5, further comprising sample control means for supplying a sampling control signal to said peak holding means, the sampling control signal indicating when the certain duration of the particular signal component ends, and
    wherein said peak holding means comprises a sample and hold circuit, operatively connected to said detector and said variable level adjusting means, for sampling the output from said detector to produce a sampled signal every time the sampling control signal is supplied and for holding the sampled signal.

8. An automatic gain control circuit as set forth in claim 7, wherein said automatic gain control circuit further receives a threshold voltage, and
    wherein said sample control means comprises a voltage comparator, having a first input operatively connected to the output of said detector and a second input operatively connected to receive the threshold voltage, for detecting a peak side level of the output from said detector in dependence upon the threshold voltage.

9. An automatic gain control circuit as set forth in claim 7, wherein the sampling control signal is realized as a timing signal generated as the certain duration ends.

10. An automatic gain control circuit as set forth in claim 9, the unmodulated carrier signal is present, under a time division multiple access mode using burst signals, as a carrier recovery part contained in each of the burst signals, and wherein said automatic gain control circuit receives the timing signal from a time division multiple access synchronization control unit.

11. An automatic gain control circuit as set forth in claim 7, wherein said sample control means comprises a selector, operatively connected to the control input of said variable level adjusting means, for initially supplying a first sampling control signal indicative of a peak side level of the output from said detector and then supplying a second sampling control signal composed of a timing signal as the certain duration ends.

12. An automatic gain control circuit as set forth in claim 11, wherein said automatic gain control circuit further receives a threshold voltage, wherein said sample control means further comprises a voltage comparator, having a first input operatively connected to the output of said detector and a second input operatively connected to receive the threshold voltage for detecting the peak side level of the output from said detector in dependence upon the threshold voltage, and wherein said automatic gain control circuit receives the second sampling control signal from a time division multiple access synchronization unit, in which the unmodulated carrier signal is present, under a time division multiple access mode using burst signals, as a carrier recovery part contained in each of the burst signals.

13. An automatic gain control circuit as set forth in claim 1, wherein said variable level adjusting means comprises a variable gain amplifier operatively connected to said band pass filter, said detector means and said particular signal filter.

14. An automatic gain control circuit as set forth in claim 1, wherein said variable level adjusting means comprises a variable voltage attenuator operatively connected to said band pass filter, said detector means and said particular signal filter.

15. An automatic gain control circuit as set forth in claim 4, wherein said narrow-band filter comprises:

an input;

an output;

first and second capacitors, operatively connected in series between the input and the output of said narrow-band filter, an intermediate connecting point therebetween;

a third capacitor and a coil connected in parallel to form a parallel circuit having one end grounded and the other end operatively connected to the intermediate connecting point between said first and second capacitors.

* * * * *